United States Patent
Arimatsu

(10) Patent No.: US 8,803,626 B2
(45) Date of Patent: Aug. 12, 2014

(54) PIEZOELECTRIC VIBRATION REED, PIEZOELECTRIC VIBRATOR, OSCILLATOR, ELECTRONIC INSTRUMENT, AND RADIO TIMEPIECE

(71) Applicant: Seiko Instruments Inc., Chiba (JP)

(72) Inventor: Daishi Arimatsu, Chiba (JP)

(73) Assignee: Seiko Instruments Inc. (JP)

( * ) Notice: Subject to any disclaimer, the term of this patent is extended or adjusted under 35 U.S.C. 154(b) by 70 days.

(21) Appl. No.: 13/628,626

(22) Filed: Sep. 27, 2012

(65) Prior Publication Data
US 2013/0082792 A1 Apr. 4, 2013

(30) Foreign Application Priority Data
Sep. 30, 2011 (JP) ................................ 2011-218236

(51) Int. Cl.
- H03H 9/00 (2006.01)
- H03H 9/10 (2006.01)
- G04R 20/00 (2013.01)
- G04R 20/10 (2013.01)
- H03H 9/21 (2006.01)

(52) U.S. Cl.
CPC ............. *G04R 20/00* (2013.01); *H03H 9/1021* (2013.01); *G04R 20/10* (2013.01); *H03H 9/21* (2013.01)

USPC .......................................... 331/156; 310/370

(58) Field of Classification Search
USPC .............................. 331/156; 333/200; 310/370
See application file for complete search history.

(56) References Cited

U.S. PATENT DOCUMENTS

| | | | | |
|---|---|---|---|---|
| 3,683,213 | A * | 8/1972 | Staudte .......................... | 310/312 |
| 8,299,863 | B2 * | 10/2012 | Tanaya et al. .................. | 331/156 |
| 2004/0056727 | A1 * | 3/2004 | Sakata et al. .................. | 331/156 |

FOREIGN PATENT DOCUMENTS

JP 2002-261558 9/2002

* cited by examiner

*Primary Examiner* — Joseph Chang
(74) *Attorney, Agent, or Firm* — Brinks Gilson & Lione

(57) ABSTRACT

A piezoelectric vibration reed includes a pair of vibrating arm portions arranged in parallel to each other and a base portion. The base portion is integrally coupled to proximal ends of the pair of the vibrating arm portions in a longitudinal direction that the vibrating arm portions extend. The base portion includes a connecting portion, a mount portion, and a narrow portion between the connecting portion and the mount portion. The base portion further includes a pair of notched portions notched respectively inwardly from both sides of the base portion in the width direction and ribs projecting outwardly in the width direction of the base portion and arranged in the interiors of the notched portions.

17 Claims, 11 Drawing Sheets

PIEZOELECTRIC VIBRATION REED, PIEZOELECTRIC VIBRATOR, OSCILLATOR, ELECTRONIC INSTRUMENT, AND RADIO TIMEPIECE

RELATED APPLICATIONS

This application claims priority under 35 U.S.C. §119 to Japanese Patent Application No. 2011-218236 filed on Sep. 30, 2011, the entire content of which is hereby incorporated by reference.

BACKGROUND OF THE INVENTION

1. Technical Field

The present invention relates to a piezoelectric vibration reed, a piezoelectric vibrator, an oscillator, an electronic instrument, and a radio timepiece.

2. Description of the Related Art

Electronic devices, such as mobile phone sets or a portable information terminal, include a piezoelectric vibrator using crystal or the like as a time-of-day source, a timing source of a control signal or a reference signal source in many cases. The piezoelectric vibrator includes a tuning-fork type piezoelectric vibration reed which is hermetically sealed in a package formed with a cavity.

The package has a structure in which a pair of glass substrates are placed one on top of another and are joined directly in a state in which one of the pair of glass substrates is formed with a depression, so that the depression is functioned as the cavity. Also, the piezoelectric vibration reed includes a pair of vibrating arm portions arranged in parallel to each other and a base portion configured to integrally fix proximal end sides of the both vibrating arm portions in the longitudinal direction, and the both vibrating arm portions are configured to vibrate (pivot) at a predetermined resonant frequency in the direction toward and away from each other from the proximal end sides as origins.

Incidentally, in recent years, downsizing of various types of electronic instruments including the piezoelectric vibrator integrated therein is in progress as represented by mobile phone sets. Therefore, further downsizing is required also for the piezoelectric vibration reed which constitutes the piezoelectric vibrator. Accordingly, for example, with regard to the piezoelectric vibration reed, reducing the length of the base portion to reduce the entire length of the piezoelectric vibration reed is under review.

However, when mounting the piezoelectric vibration reed, it is mounted via the base portion, and if the length of the base portion is reduced, mount performance may be affected. Therefore, the base portion is designed to have a possible shortest length but at the same time, the length of the base portion should be within a range which does not affect the mount performance.

A vibration leak (leak of vibration energy) may occur through the base portion when the piezoelectric vibration reed is operated. The vibration leak may cause increase in a CI (Crystal Impedance), so that it is necessary to inhibit the vibration leak as much as possible. Vibrations of the vibrating arm portions may be stabilized by maximizing the length of the base portion. However, as described above, since the length of the base portion is designed so that the length is minimized within a range in which the stable mount performance can be secured in terms of downsizing, it is required to inhibit the vibration leak without changing the length.

Therefore, for example, a configuration in which notched portions (so-called notches) notched from both sides of the base portion toward the center in the width direction thereof are formed on the base portion between a connecting portion with respect to the vibration arm portions and a mount portion, and a narrow portion formed with the notched portions is formed to be narrower than other portions of the base portion is described in JP-A-2002-261558.

In this configuration, the vibrations excited by the vibrating arm portions are confined on the side of the vibrating arm portions, thereby being inhibited from leaking to the side of the base portion.

Here, in the configuration in JP-A-2002-261558, the deeper the notched portions, that is, the narrower the narrow portion, the more the width of a route through which the vibrations of the vibrating arm portions are transmitted to the base portion is reduced. Therefore, the vibrations may be confined on the side of the vibrating arm portions, and hence the effect of inhibiting the vibration leak is considered to be enhanced.

However, the rigidity with respect to an external impact or the like may be lowered as the width of the narrow portion is reduced. In contrast, when the width of the narrow portion is increased, the sufficient effect of inhibiting the vibration leak as described above cannot be obtained.

SUMMARY

In view of the problem described above, it is an object of the invention to provide a piezoelectric vibration reed, a piezoelectric vibrator, an oscillator, an electronic apparatus, and a radio timepiece which is capable of inhibiting vibration leak effectively while achieving downsizing, and maintaining sufficient rigidity. In order to solve the problems as described above, the invention employs following means.

One embodiment of a piezoelectric vibration reed includes a pair of vibrating arm portions arranged in parallel to each other; and a base portion configured to integrally fix the proximal end sides in the longitudinal direction of the pair of the vibrating arm portions. The base portion includes a connecting portion which is located on the distal end side along the longitudinal direction and to which the proximal end sides of the vibrating arm portions are fixed and a mount portion located on the proximal end side along the longitudinal direction for mounting the base portion. The base portion is formed with a narrow portion between the connecting portion and the mount portion, the narrow portion having a length along the width direction narrower than the length of the connecting portion and the mount portion extending along the width direction by a pair of notched portions notched respectively inward from both sides in the width direction orthogonal to the longitudinal direction. the narrow portion is formed with ribs projecting outward in the width direction of the base portion and exposed into the interiors of the notched portions.

In this configuration, a route through which vibrations excited by the vibrating arm portions are transmitted to the base portion is narrowed by the narrow portion formed by the notched portions. Therefore, the vibrations are confined on the side of the vibrating arm portions, so that the vibration leak toward the base portion is inhibited. Accordingly, the vibration leak is effectively inhibited, and a CI value is prevented from increasing, whereby the deterioration of the quality of an output signal may be inhibited.

In particular, since the narrow portion is formed with the ribs projecting toward the outside in the width direction, rigidity of the base portion may be enhanced. Therefore, even when the notched portions are deeper than the related art, that is, the length along the width direction of the narrow portion is reduced in order to inhibit the vibration leak, the rigidity of the base portion can be maintained sufficiently and damage or the like of the base portion may be inhibited.

Therefore, the downsizing is achieved, and the vibration leak is effectively inhibited while maintaining the sufficient rigidity.

Preferably, in the piezoelectric vibration reed according to the invention, the ribs are formed at intermediate portions of the narrow portion in the thickness direction orthogonal to the longitudinal direction and the width direction of the base portion.

In this case, by forming the ribs at the intermediate portions of the narrow portion in the thickness direction, improvement of the balance of the rigidity of the base portion is achieved.

Preferably, in the piezoelectric vibration reed according to the invention, the thickness of the ribs along the thickness direction orthogonal to the width direction and the longitudinal direction of the base portion is set to be ½ or smaller with respect to the thickness of the base portion.

In this case, by setting the thickness of the ribs to be ½ or smaller than the base portion, the route through which the vibrations excited by the vibrating arm portions are transmitted to the base portion is reliably reduced, and hence the vibration leak may be effectively inhibited.

Preferably, in the piezoelectric vibration reed according to the invention, the thickness of the ribs along the thickness direction orthogonal to the width direction and the longitudinal direction of the base portion is set to be ⅓ or larger with respect to the thickness of the base portion.

In this case, by setting the thickness of the ribs to be ⅓ or larger with respect to the base portion, the rigidity of the base portion is sufficiently secured.

According to a second aspect of the invention, there is provided a piezoelectric vibrator, wherein the piezoelectric vibration reed of the invention is hermetically sealed in a package.

In this case, since the piezoelectric vibration reed of the invention is provided, the piezoelectric vibrator having high reliability and high quality which can inhibit the vibration leak effectively while achieving downsizing and maintaining a sufficient rigidity is provided.

According to a third aspect of the invention, there is provided an oscillator wherein the piezoelectric vibrator according to the invention is electrically connected to an integrated circuit as an oscillating element.

According to a fourth aspect of the invention, there is provided an electronic instrument wherein the piezoelectric vibrator of the invention is electrically connected to a clocking unit.

According to a fifth aspect of the invention, there is provided a radio timepiece wherein the piezoelectric vibrator of the invention is electrically connected to a filter portion.

A piezoelectric vibration reed, includes a pair of vibrating arm portions arranged in parallel to each other and a base portion integrally coupled to proximal ends of the pair of the vibrating arm portions in a longitudinal direction that the vibrating arm portions extend. The base portion includes (1) a connecting portion which is located on a distal end side of the base portion along the longitudinal direction and to which the proximal end of the vibrating arm portions are coupled; (2) a mount portion located on a proximal end of the base portion along the longitudinal direction for mounting the base portion; (3) a narrow portion between the connecting portion and the mount portion, the narrow portion having a length narrower than a length of the connecting portion and a length of the mount portion in a width direction of the piezoelectric vibration reed which is perpendicular to the longitudinal direction; (4) a pair of notched portions notched respectively inwardly from both sides of the base portion in the width direction; and (5) ribs projecting outwardly in the width direction of the base portion and arranged in the interiors of the notched portions.

In another embodiment, the ribs are formed at one end of the narrow portion in a thickness direction orthogonal to the longitudinal direction and the width direction of the base portion.

Alternatively, or additionally, each notched portion has a circular shape. In another embodiment, a width of each notched portion in the longitudinal direction is gradually reduced from an outside toward an inside of the piezoelectric vibration reed in the width direction. Further, in another embodiment, a width of each notched portion in the longitudinal direction is smaller than a width of the ribs in the longitudinal direction.

In another embodiment, a distal end of a vibrating arm portion is enlarged to form a hammer-shape portion. Alternatively, each vibrating arm portion comprises a groove having a rectangular shape extending in the longitudinal direction.

Further in another embodiment, the connecting portion includes a first base portion and a second base portion and a width of the connecting portion increases in a width direction orthogonal to the longitudinal direction, and a width of the first base portion is smaller than a width of the second base portion.

In another embodiment, the mount portion further includes side arms extended toward both sides.

In this configuration, since the piezoelectric vibrator of the invention is provided, the oscillator, the electronic instrument, and the radio timepiece having high reliability and high quality are provided while achieving downsizing and maintaining a sufficient rigidity.

According to the piezoelectric vibration reed of the invention, the vibration leak is effectively inhibited while achieving the downsizing and maintaining the sufficient rigidity.

According to the piezoelectric vibrator of the invention, since the piezoelectric vibration reed of the invention is provided, the piezoelectric vibrator having high reliability and high quality which can inhibit the vibration leak effectively while achieving the downsizing and maintaining the sufficient rigidity is provided.

According to the oscillator, the electronic apparatus, and the radio timepiece of the invention, the oscillator, the electronic instrument, and the radio timepiece having high reliability and high quality while achieving the downsizing and maintaining the sufficient rigidity are provided.

DESCRIPTION OF THE PREFERRED EMBODIMENTS

Figure 1:
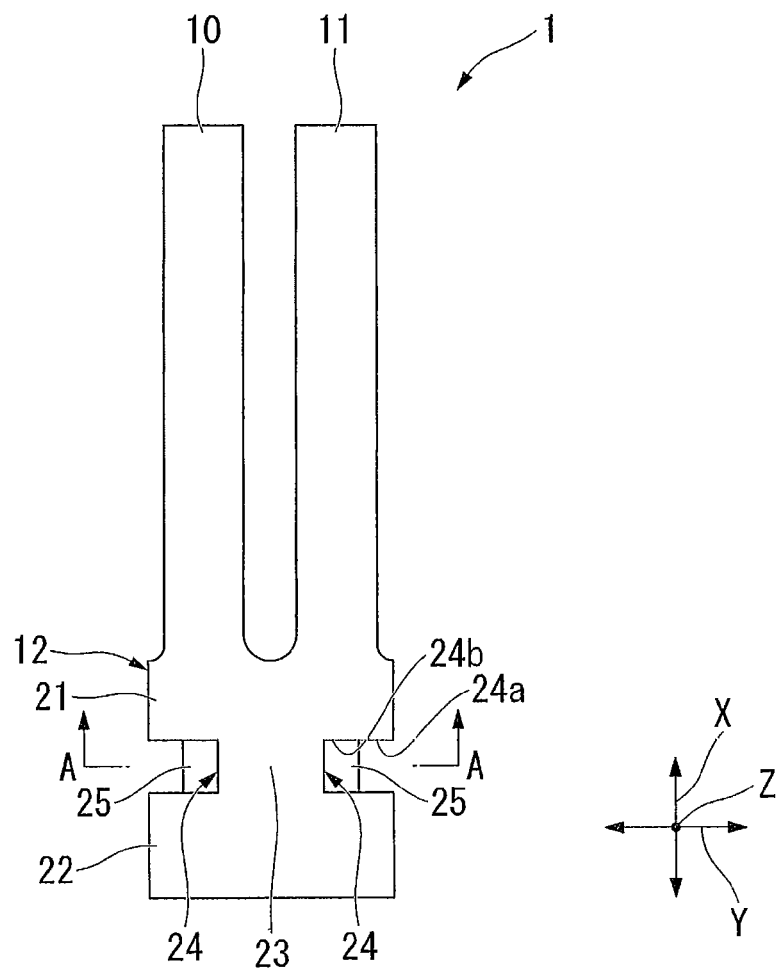
FIG. 1 is a plan view of one embodiment of a piezoelectric vibration reed.

Referring now to the drawings, an embodiment of the invention will be described below.
(Piezoelectric Vibration Reed)

As shown in FIG. 1, a piezoelectric vibration reed 1 is a turning-fork type vibration reed formed of a piezoelectric material such as crystal, lithium tantalate, or lithium niobate, and includes a pair of vibrating arm portions 10 and 11 arranged so as to extend in parallel to each other and a plate-shaped base portion 12 configured to integrally fix proximal end sides in the longitudinal direction of the pair of vibrating arm portions 10 and 11. In the description given below, a direction in which the piezoelectric vibration reed 1 extends (the longitudinal direction of the vibrating arm portions 10 and 11) is defined as an X-direction, a width direction (the direction in which the vibrating arm portions 10 and 11 are arranged) orthogonal to the X-direction on a main surface of the piezoelectric vibration reed 1 is defined as a Y-direction, and the thickness direction orthogonal to the X-direction and the Y-direction is defined as a Z-direction.

The pair of vibrating arm portions 10 and 11 are formed with excitation electrodes, not shown, configured to vibrate the pair of vibrating arm portions 10 and 11 on outer surfaces thereof. The base portion 12 is formed with a mount electrode, not shown, on an outer surface thereof, which is electrically connected to the excitation electrodes by a drawing electrode (not shown).

When a predetermined voltage is applied to the electrodes, the vibrating arm portions 10 and 11 vibrate at a predetermined resonant frequency in the direction toward and away from each other (the Y-direction) by a mutual action between the excitation electrodes of both of the vibrating arm portions 10 and 11.

Figure 2:
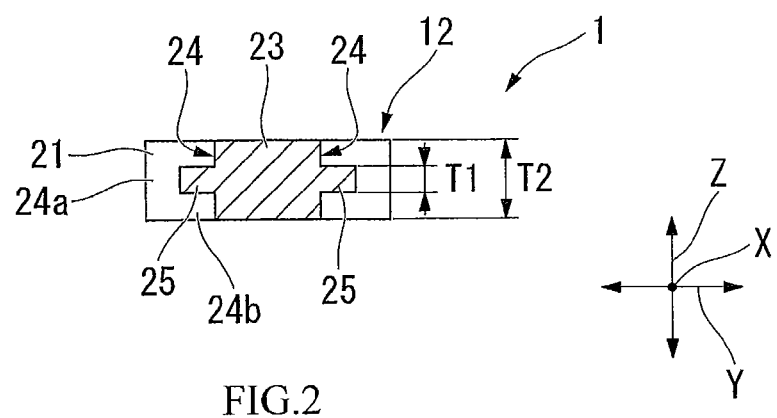
FIG. 2 is a cross-sectional view taken along the line A-A in FIG. 1.

The base portion 12 described above is formed into a rectangular shape in plan view having the longitudinal direction in the X-direction as shown in FIG. 1 and FIG. 2. More specifically, the base portion 12 includes a connecting portion 21 which is located on a distal end side along the X-axis direction (the side of the vibrating arm portions 10 and 11) and to which the proximal end sides of the vibrating arm portions 10 and 11 are fixed, a mount portion 22 positioned on a proximal end side along the X-direction with respect to the connecting portion 21, and a narrow portion 23 positioned between the connecting portion 21 and the mount portion 22 and having a length along the Y-direction (width) smaller than the connecting portion 21 and the mount portion 22.

The mount portion 22 is a portion used for mounting the base portion 12 (the piezoelectric vibration reed 1) on a package or the like, described later, and is formed with the mount electrode, described above, on an outer surface thereof.

Here, the narrow portion 23 described above is formed at an intermediate portion of the base portion 12 along the X-direction between a pair of notched portions 24 notched respectively from both sides in the Y-direction inward in the Y-direction, and integrally couples the connecting portion 21 and the mount portion 22.

Both end surfaces in the Y-direction of the narrow portion 23 are continuously provided with ribs 25 respectively projecting outward in the Y-direction and exposed in the interiors of the notched portions 24. More specifically, the ribs 25 are thin plates having a rectangular shape in plan view, and are continuously provided so as to bridge portions between the connecting portion 21 and the mount portion 22 in the X-direction as shown in FIG. 1. In other words, distal end sides of the ribs 25 along the X-direction are provided so as to continue to a proximal end surface of the connecting portion 21 in the X-direction, and proximal end sides thereof along the X-direction are provided so as to continue to a distal end surface of the mount portion 22 in the X-direction.

An outside end portions of the ribs 25 in the Y-direction are located at intermediate portions of the notched portions 24 along the Y-direction. In other words, the outside end portions of the ribs 25 in the Y-direction are located inside the connecting portion 21 and the mount portion 22 in the Y-direction.

Furthermore, as shown in FIG. 2, the ribs 25 are provided so as to continue to intermediate portions of the narrow portion 23 in the Z-direction. In this case, a thickness T1 of the ribs 25 along the X-direction is preferably set to a range between ⅓ and ½ inclusive a thickness T2 of the base portion 12 in the Z-direction (⅓·T2≤T1≤½·T2). By setting the thickness T1 of the ribs 25 along the Z-direction to be ⅓ or more the thickness T2 of the base portion 12 along the Z-direction, sufficient rigidity of the base portion 12 is preferably secured. By setting the thickness T1 of the ribs 25 along the Z-direction to be ½ or less the thickness T2 of the base portion 12 along the Z-direction, an effective inhibition of a vibration leak, described later, is preferably achieved.

In this manner, the notched portions 24 described above are notched at the both sides of the base portion 12 in the Y-direction so as to oppose each other from the same position along the X-direction. Then, outsides of the respective notched portions 24 in the Y-direction described above form first notched portions 24a penetrating along the Z-direction. Also, insides of the respective notched portions 24 in the Y-direction communicate with the first notched portions 24a and form second notched portions 24b notched inward from both sides of the base portion 12 in the Z-direction in a state in which parts (the ribs 25) of the base portion 12 along the Z-direction are remained. The first notched portions 24a and the second notched portions 24b of this embodiment are set so that the width along the X-direction and the depth along the Y-direction are the same in plan view.

Incidentally, in order to manufacture the piezoelectric vibration reed 1 configured as described above, first of all, an contour pattern of the piezoelectric vibration reed 1 having the vibrating arm portions 10 and 11 and the base portion 12 is formed on both surfaces of a wafer, not shown, by Photolithography technology. At this time, in the base portion 12, the contour pattern is formed so that areas for forming the first notched portions 24a are opened. In this case, a plurality of the contour patterns are formed on the wafer.

Subsequently, the both surfaces of the wafer are etched, respectively with the contour pattern used as a mask. Accordingly, areas which are not masked by the contour pattern are selectively removed, whereby the contours of the piezoelectric vibration reeds 1 are formed. In this state, the respective piezoelectric vibration reeds 1 are in a state of being coupled to the wafer via connecting portions (not shown).

Subsequently, areas of the above-described contour pattern where the second notched portions 24b are formed are opened. In this state, the both surfaces of the wafer are etched (half etching) with the contour pattern used as the mask. Then, each of the base portions 12 is formed with the notched portions 24 including the first notched portions 24a penetrating therethrough in the Z-direction and the second notched portions 24b notched in a state in which parts in the Z-direction are remained. Accordingly, the narrow portion 23 is formed between the notched portions 24, and the ribs 25 projecting outward in the Y-direction from the narrow portion 23 remain in the notched portions.

Subsequently, an electrode film is patterned on the outer surface of the piezoelectric vibration reed 1 to form the excitation electrodes, the drawing electrode, and the mount electrode by the known method.

Then, a cutting step in which the connecting portions which connect the wafer and the piezoelectric vibration reeds 1 are finally cut off, is performed. In the cutting step, a plurality of the piezoelectric vibration reeds 1 are cut off from the wafer and are separated into individual pieces. Accordingly, a plurality of the tuning-fork type piezoelectric vibration reeds 1 may be manufactured at once from a single wafer.

In this manner, in this embodiment, the base portion 12 is formed with the narrow portion 23 between the connecting portion 21 and the mount portion 22 between the pair of notched portions 24 notched inward from the both sides of the base portion 12 in the Y-direction.

In this configuration, a route through which vibrations excited by the vibrating arm portions 10 and 11 are transmitted to the base portion 12 is narrowed by the narrow portion 23 formed by the notched portions 24. Therefore, the vibrations are confined on the side of the vibrating arm portions 10 and 11, so that leak toward the base portion 12 is inhibited. Accordingly, the vibration leak is effectively inhibited, and a CI value is inhibited from increasing, whereby the deterioration of the quality of an output signal may be inhibited.

In particular, in this embodiment, since the narrow portion 23 is formed with the ribs 25 projecting outward in the Y-direction, rigidity of the base portion 12 may be enhanced. Therefore, even when the notched portions 24 are deeper than the related art, that is, the length along the Y-direction of the narrow portion 23 is reduced in order to inhibit the vibration leak, the rigidity of the base portion 12 can be maintained sufficiently and damage or the like of the base portion 12 may be inhibited.

Therefore, downsizing is achieved, and at the same time, the vibration leak is effectively inhibited while maintaining the sufficient rigidity. In this case, the depth of the first notched portions 24a is preferably set to an extent which allows the rigidity of the base portion 12 to be secured sufficiently, and the depth of the second notched portions 24b is preferably set to an extent which allows the vibration leak to be inhibited sufficiently.

In this embodiment, since the ribs 25 are formed on the narrow portion 23 at the intermediate portions in the Z-direction, the balance of the rigidity of the base portion 12 is improved, and the damage or the like of the base portion 12 are reliably inhibited.

Furthermore, by setting the thickness T1 of the ribs 25 along the Z-direction to ½ or smaller than the thickness T2 of the base portion 12, the route through which the vibrations excited by the vibrating arm portions 10 and 11 are transmitted to the base portion 12 is reliably reduced, and hence the vibration leak may be effectively inhibited.

In contrast, by setting the thickness T1 of the ribs 25 along the Z-direction to be ⅓ or more of the thickness T2 of the base portion 12, the sufficient rigidity of the base portion 12 is secured.

Figure 3:
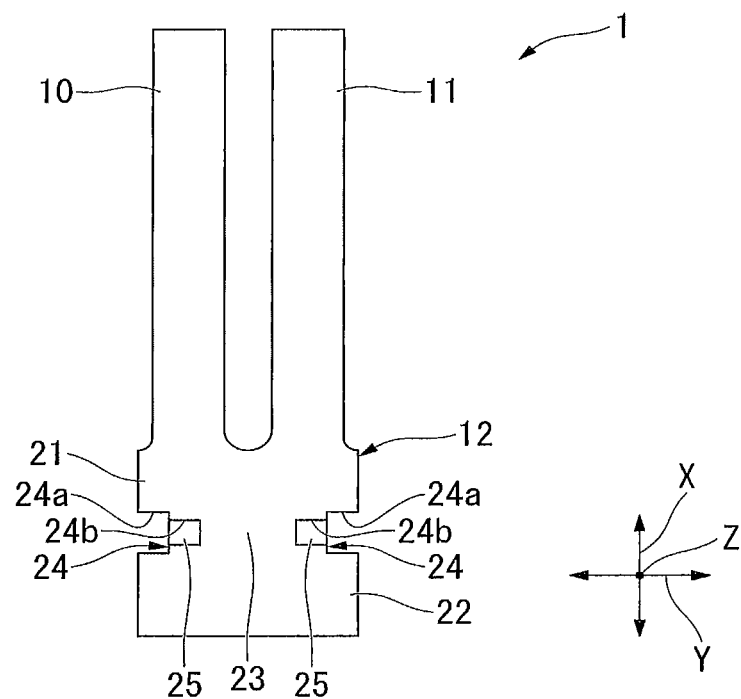
FIG. 3 is a plan view showing another embodiment of the piezoelectric vibration reed.

In the embodiment described above, the case where the first notched portions 24a and the second notched portions 24b are formed in the same shape in plan view has been described. However, the invention is not limited thereto. For example, as shown in FIG. 3, the width of the second notched portions 24b along the X-direction may also be formed to be smaller than that of the first notched portions 24a. In other words, the width of the ribs 25 along the X-direction may also be formed to be smaller than that of the notched portions 24.

Figure 4:
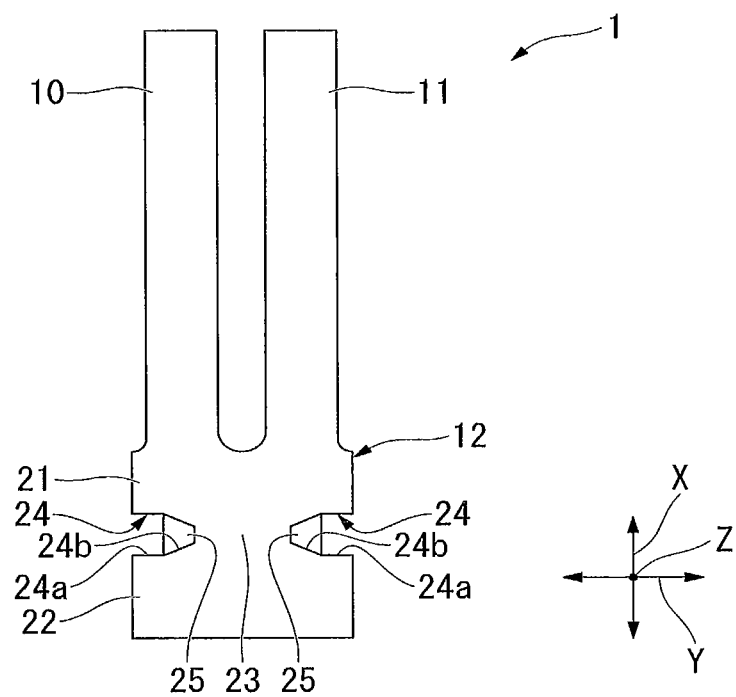
FIG. 4 is a plan view showing another embodiment of the piezoelectric vibration reed.

Alternatively, as shown in FIG. 4, the second notched portions 24b (ribs 25) may be formed so that the width along the X-direction is gradually reduced from the outside toward the inside in the Y-direction.

Figure 5:
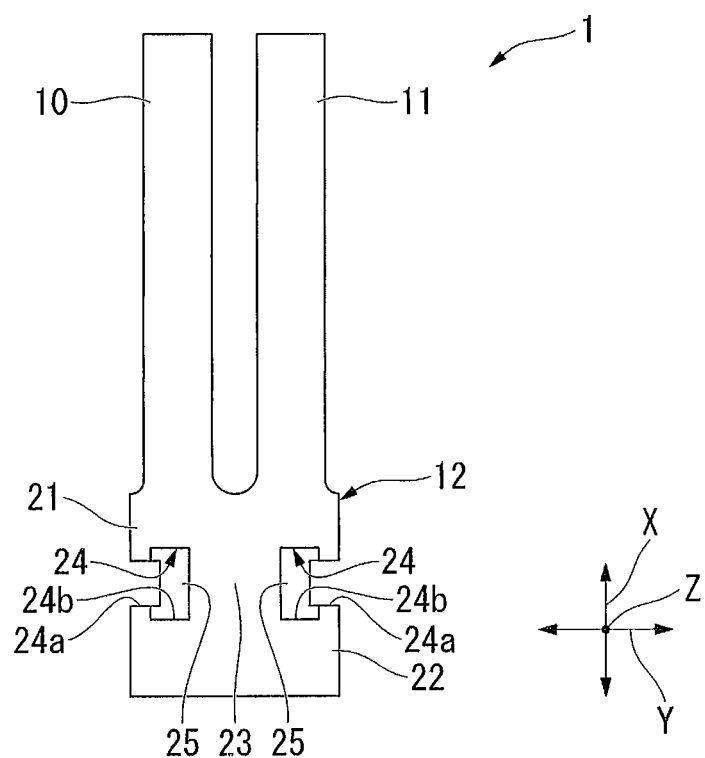
FIG. 5 is a plan view showing another embodiment of the piezoelectric vibration reed.

Furthermore, as shown in FIG. 5, the width of the second notched portions 24b along the X-direction may also be formed to be larger than that of the first notched portions 24a. In other words, the width of the ribs 25 along the X-direction may also be formed to be larger than that of the notched portions 24.

Figure 6:
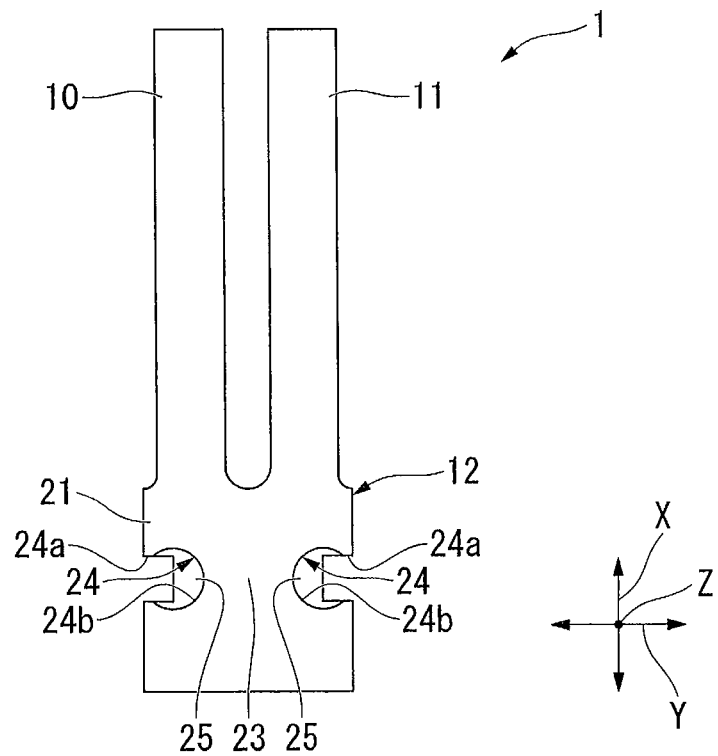
FIG. 6 is a plan view showing another embodiment of the piezoelectric vibration reed.

Also, as shown in FIG. 6, different modifications in design may be performed such as forming the second notched portions 24b (the ribs 25) into a circular shape in plan view.

In the respective configurations as described above, the same advantageous effects as in those of the embodiment described above are achieved.

Figure 7:
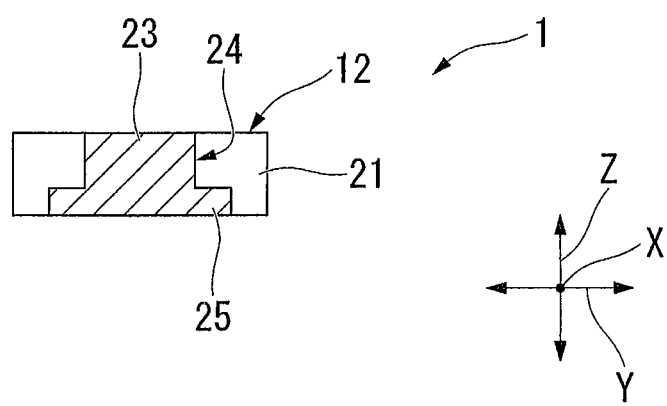
FIG. 7 is a drawing showing another embodiment of the piezoelectric vibration reed, and is a cross-sectional view corresponding to FIG. 2.

In the embodiment described above, the case where the ribs 25 are formed on the narrow portion 23 in the intermediate portions along the Z-direction has been described. The invention, however, is not limited thereto, and the ribs 25 may be formed at arbitrary positions along the Z-direction. For example, the ribs 25 may be formed on the narrow portion 23 at one end along the Z-direction as shown in FIG. 7. In the embodiment described above, the case where the ribs 25 are formed continuously along the Y-direction between the notched portions 24 has been described. The invention, however, is not limited thereto, and the ribs 25 may be formed intermittently along the Y-direction. In any event, different modifications in design may be made as long as the ribs 25 project from the narrow portion 23 toward the insides of the notched portions 24.

A configuration in which a plurality of the ribs 25 project from the narrow portion 23 toward the insides of the notched portions 24 is also applicable.

(First Modification)

Subsequently, a different embodiment of the above-described embodiment including first modification will be described. In the respective modifications described below, the same components as in the embodiment described above are designated by the same reference numerals and the description thereof is omitted.

Figure 8:
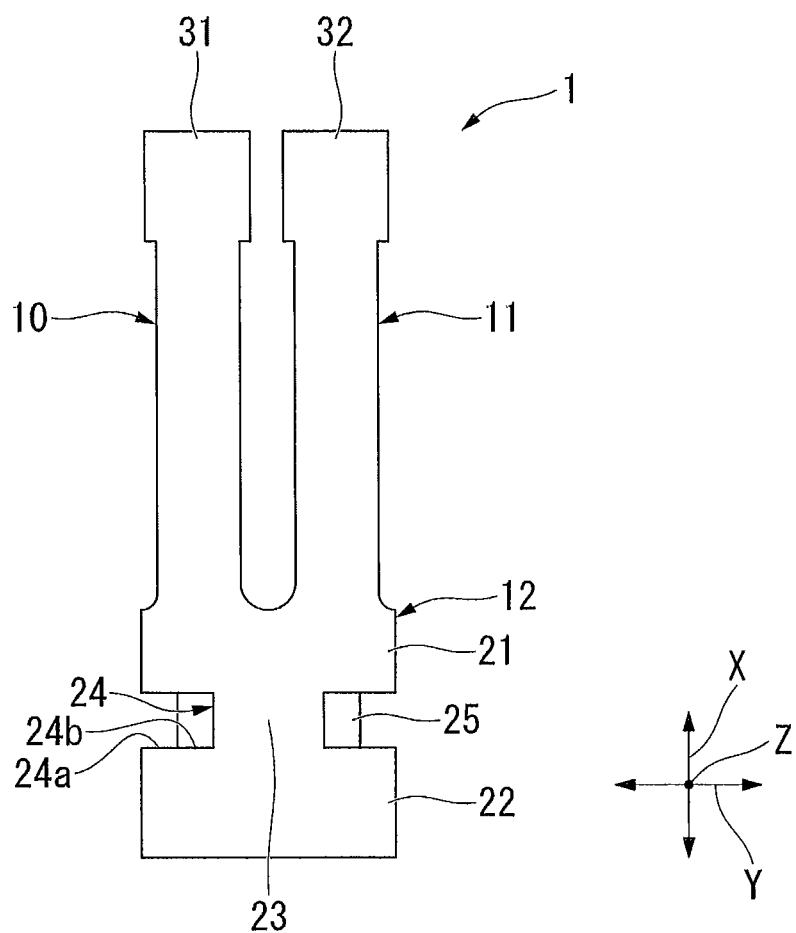
FIG. 8 is a plan view of a piezoelectric vibration reed according to a first modification of the piezoelectric vibration reed shown in FIG. 1.

As shown in FIG. 8, the piezoelectric vibration reed 1 of this embodiment is formed with hammer portions 31 and 32 enlarged in comparison with proximal end portions in length (width) along the Y-direction at distal end portions of the vibrating arm portions 10 and 11 (so-called a hammer-head type).

In this embodiment, with the formation of the hammer portions 31 and 32, the distal end portions of the vibrating arm portions 10 and 11 may further be increased in weight, so that the inertia moment at the time of the vibrations may be increased. Therefore, the vibrations of the vibrating arm portions 10 and 11 may be facilitated, and hence the length of the vibrating arm portions 10 and 11 may be reduced correspondingly, so that further downsizing can easily be achieved.

(Second Modification)

Figure 9:
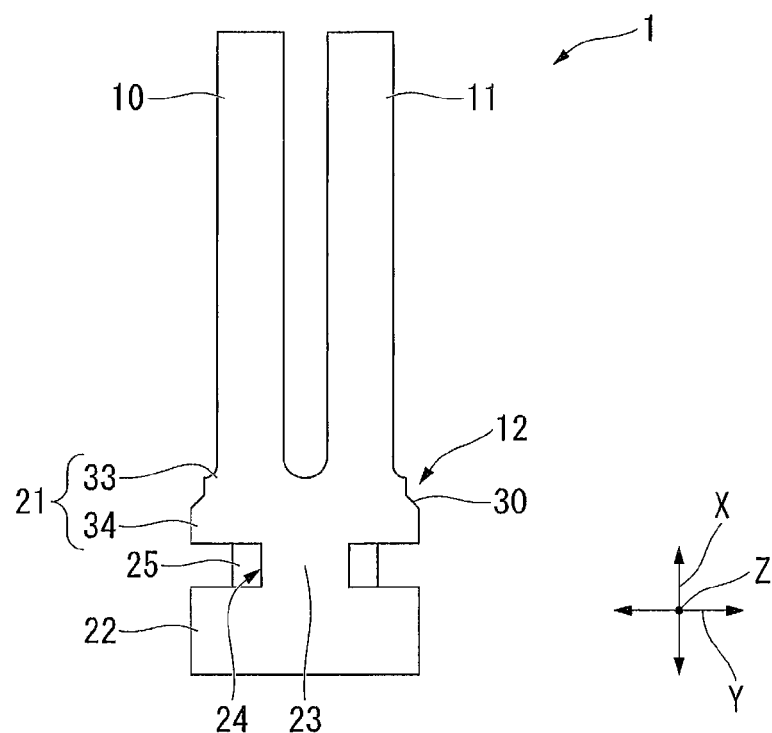
FIG. 9 is a plan view of a piezoelectric vibration reed according to a second modification of the piezoelectric vibration reed shown in FIG. 1.

As shown in FIG. 9, in the piezoelectric vibration reed 1 of this modification, the connecting portion 21 of the base portion 12 is enlarged in multi-stepwise from the distal end side toward the proximal end side along the X-direction. More specifically, the connecting portion 21 of this modification includes a first base portion 33 on the side of the distal end along the X-direction and a second base portion 34 provided so as to continue from the first base portion 33 on the side of the proximal end portion and increased in width with respect to the first base portion 33 (so-called a two-shouldered base portion type). Connecting portions between the first base portion 33 and the second base portion 34 are formed to be inclined surfaces 30 gradually increasing in width therebetween from the side of the distal end potion toward the side of the proximal end portion along the X-direction.

In this configuration, the route through which the vibrations excited by the vibrating arm portions 10 and 11 are transmitted to the second base portion 34 side can be narrowed by the narrowed first base portion 33, so that the vibrations are confined on the side of the vibrating arm portions 10 and 11 and are easily inhibited from leaking toward the second base portion 34. Accordingly, the vibration leak is effectively inhibited, and the CI value is inhibited from increasing, whereby the deterioration of the quality of the output signal may be inhibited.

(Third Modification)

Figure 10:
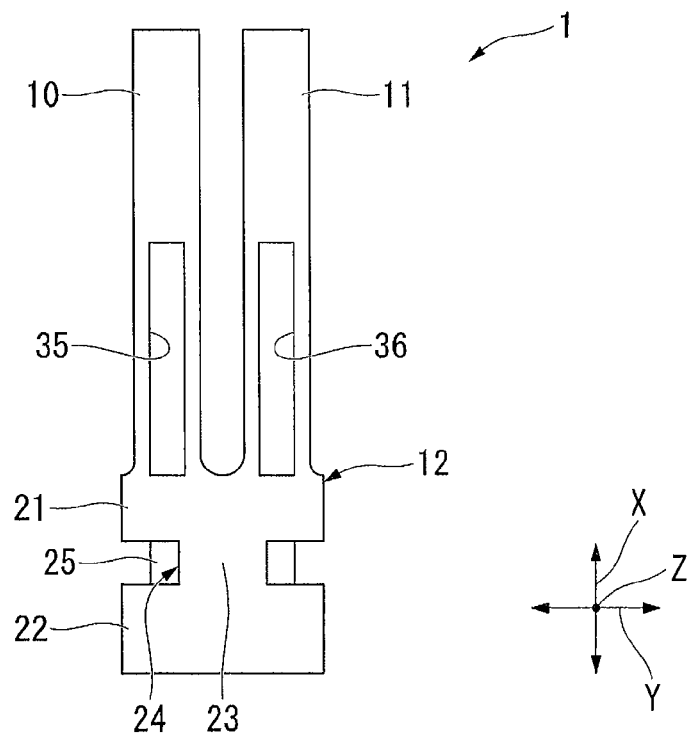
FIG. 10 is a plan view of a piezoelectric vibration reed according to a third modification of the piezoelectric vibration reed shown in FIG. 1.

As shown in FIG. 10, the piezoelectric vibration reed 1 of this modification is formed with groove portions 35 and 36 depressed along the Z-direction on both main surfaces of the vibrating arm portions 10 and 11. The groove portions 35 and 36 are formed into a rectangular shape having the longitudinal direction in the X-direction in plan view, and formed from the proximal end sides of the vibrating arm portions 10 and 11 to the substantially intermediate portions thereof.

In this configuration, with the formation of the groove portions 35 and 36, the excitation electrodes which constitute a pair in the vibrating arm portions 10 and 11 opposing each other on both sides of the groove portions 35 and 36 in the Y-direction, so that an electric field may be caused to act efficiently in this opposed directions. Accordingly, enhancement of the electrical field efficiency is achieved even when the length of the vibrating arm portions 10 and 11 along the Y-direction is reduced, so that the downsizing is achieved while improving the quality.

(Fourth Modification)

Figure 11:
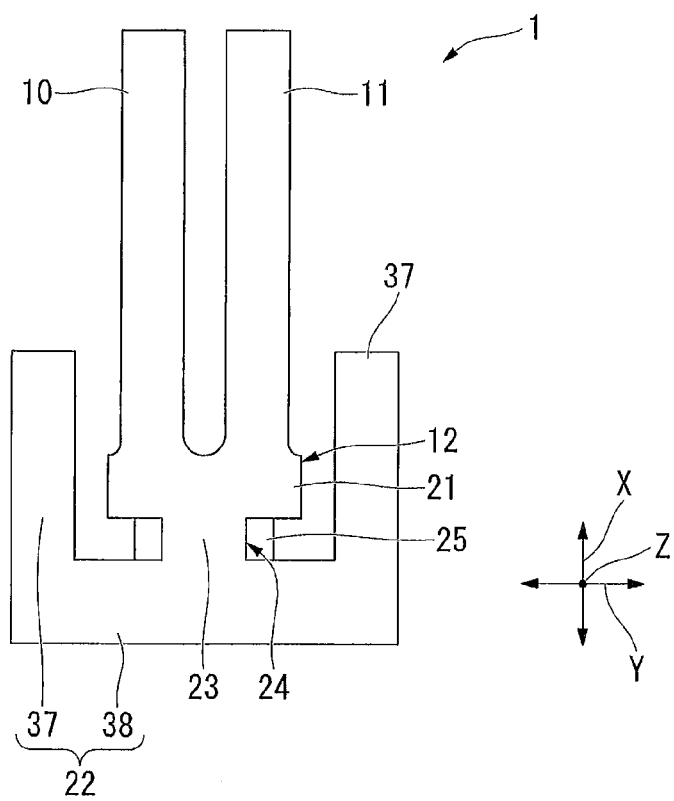
FIG. 11 is a plan view of a piezoelectric vibration reed according to a fourth modification of the piezoelectric vibration reed shown in FIG. 1.

As shown in FIG. 11, in the piezoelectric vibration reed 1 of this modification, a pair of side arms 37 are integrally formed on the mount portion 22 of the base portion 12 (so-called a side-arm type). More specifically, the mount portion 22 of this modification includes a mount portion body 38 arranged on the side opposite the connecting portion 21 along the X-direction with the narrow portion 23 interposed therebetween and the pair of side arms 37 extending along the X-direction on both sides of the mount portion body 38 in the Y-direction.

More specifically, the respective side arms 37 are formed into an L-shape in plan view extending from the mount portion body 38 toward the both sides in the Y-direction and extending from outer side portions thereof toward the vibrating arm portions 10 and 11 along the X-direction. In other words, the respective side arms 37 are positioned on the both sides of the base portion 12 and the proximal end portions of the vibrating arm portions 10 and 11 in the Y-direction, and distal end portions thereof are positioned at intermediate portions of the vibrating arm portions 10 and 11 in the X-direction.

In this case, the piezoelectric vibration reed 1 may be mounted, for example, on the package or the like via the distal end portions of the side arms 37.

In this configuration, a long distance can be secured between the connecting portions 21 with respect to the vibrating arm portions 10 and 11 and the mount portions (the distal end portions of the side arms 37) of the base portion 12. Consequently, the vibration leak is inhibited, and the CI value is prevented from increasing, whereby the deterioration of the quality of the output signal may be inhibited without increasing the entire length of the piezoelectric vibration reed 1.

(Piezoelectric Vibrator)

Subsequently, a piezoelectric vibrator 50 using the piezoelectric vibration reed 1 according to the embodiment described above will be described. Here, as the piezoelectric vibration reed 1 (see FIG. 13), a configuration in which the above-described embodiment and the respective modifications are combined is employed, and the same configurations as those in the embodiment and the respective modifications are designated by the same reference numerals, and the description thereof is omitted.

As shown in FIG. 12 to FIG. 15, the piezoelectric vibrator 50 in this embodiment is a surface-mounted type piezoelectric vibrator including a box-shaped package 53 in which a base substrate 51 and a lid substrate 52 are joined by, for example, anodic wafer joining or joined via a joint film or the like, not shown, and the piezoelectric vibration reed 1 accommodated in a cavity C formed in the interior of the package 53 and mounted on the base substrate 51.

Figure 12:
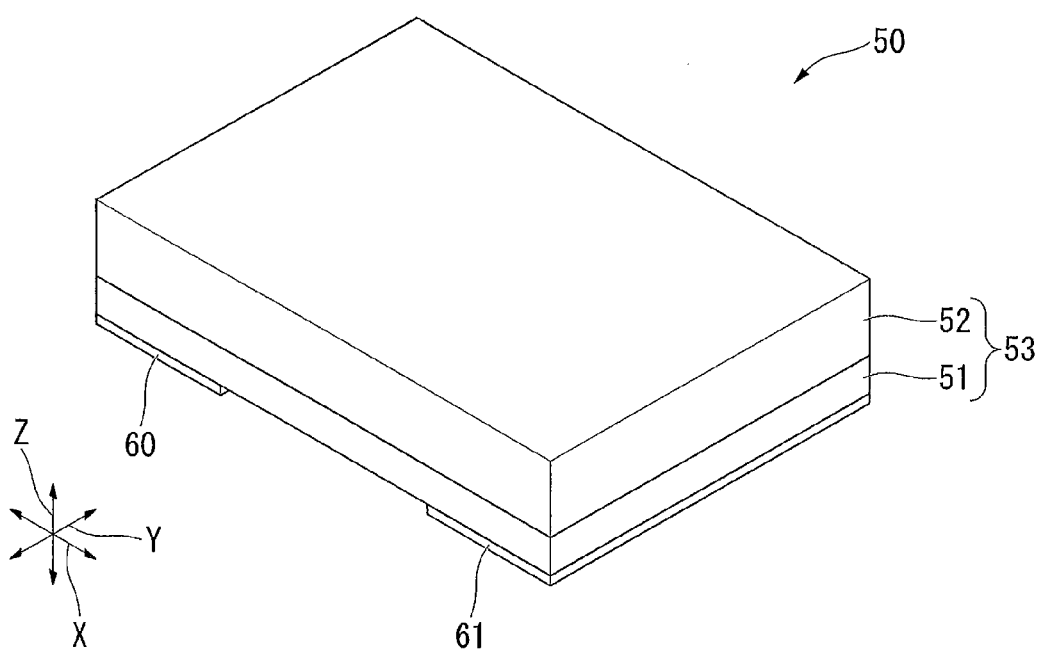
FIG. 12 is an appearance perspective view of one embodiment of a piezoelectric vibrator.
Figure 13:
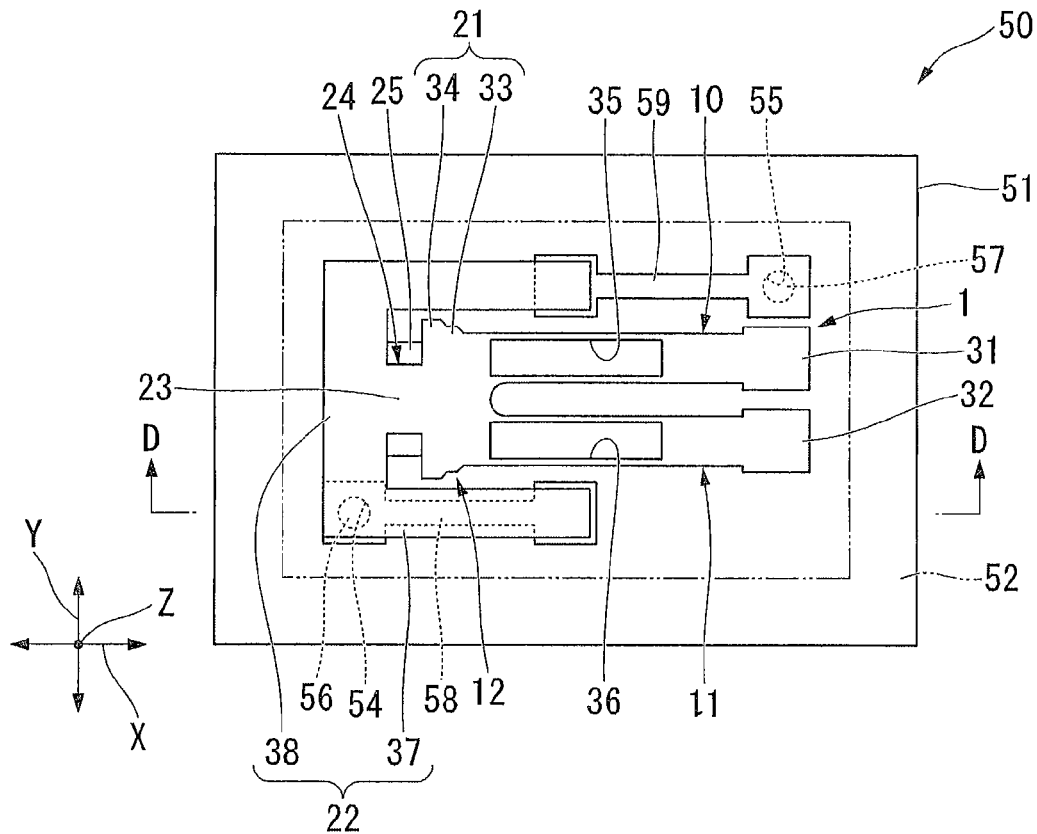
FIG. 13 is a plan view showing an internal configuration of the piezoelectric vibrator shown in FIG. 12 in a state in which a lid substrate is removed.

As shown in FIG. 12 and FIG. 13, the base substrate 51 and the lid substrate 52 are transparent insulative substrates formed of a glass material, for example, a soda-lime glass, and are formed into a substantially plate shape. The lid substrate 52 is formed with a rectangular depression 52a for accommodating the piezoelectric vibration reed 1 on the side of a joint surface where the base substrate 31 is joined. The depression 52a functions as a depression defining the cavity C for accommodating the piezoelectric vibration reed 1 when the base substrate 51 and the lid substrate 52 are stacked one on top of another so as to oppose each other.

As shown in FIG. 13, the base substrate 51 is formed with a pair of through holes 54 and 55 configured to penetrate the base substrate 51 in the Z-direction. The through holes 54 and 55 are formed at a position accommodated within the cavity C. More specifically, the through holes 54 and 55 of the embodiment are such that one through hole 54 is formed at a position corresponding to the side of the base portion 12 of the piezoelectric vibration reed 1 mounted thereon (proximal end side of the side arms 37) and the other through hole 55 is formed at a position corresponding to the side of the hammer portions 31, 32 of the vibrating arm portions 10 and 11.

Then, a pair of through electrodes 56 and 57 are formed in the pair of through holes 54 and 55 so as to embed the through holes 54 and 55. The through electrodes 56 and 57 are conductive core members fixed integrally with the through holes 54 and 55, for example, and are formed so as to be flat at both ends thereof and have a substantially same thickness as the thickness of the base substrate 51. Accordingly, the electric conductivity is secured on both surfaces of the base substrate 51 while maintaining air-tightness in the cavity C.

The through electrodes 56 and 57 are not limited to the configuration described above, and may be formed, for example, by inserting metal pins, not shown, into the through holes 54 and 55, then filling glass frit between the through holes 54 and 55 and the metal pins and sintering the same. Furthermore, a conductive adhesive agent embedded in the through holes 54 and 55 is also applicable.

Figure 14:
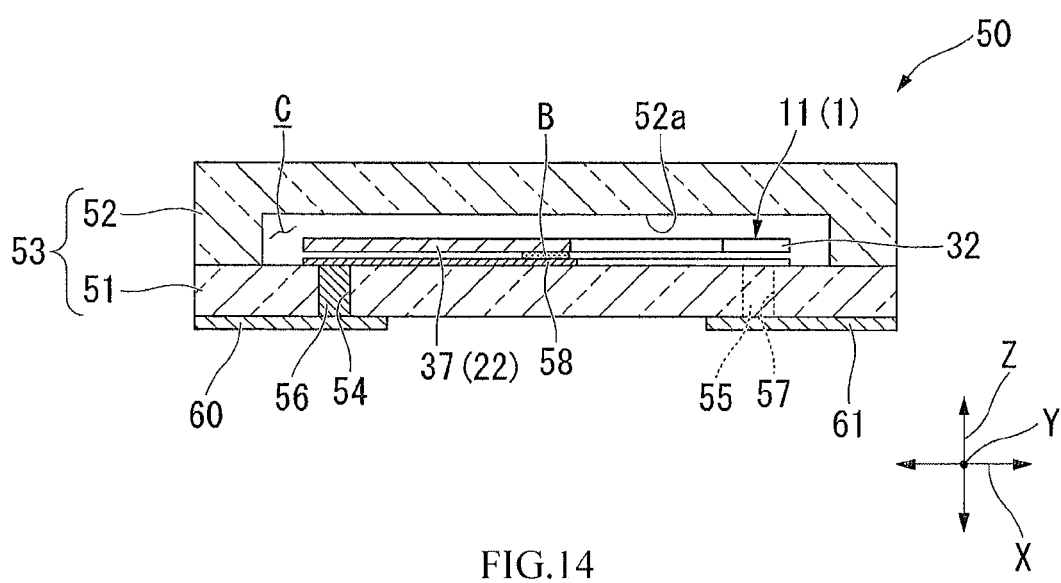
FIG. 14 is a cross-sectional view taken along the line D-D in FIG. 13.
Figure 15:
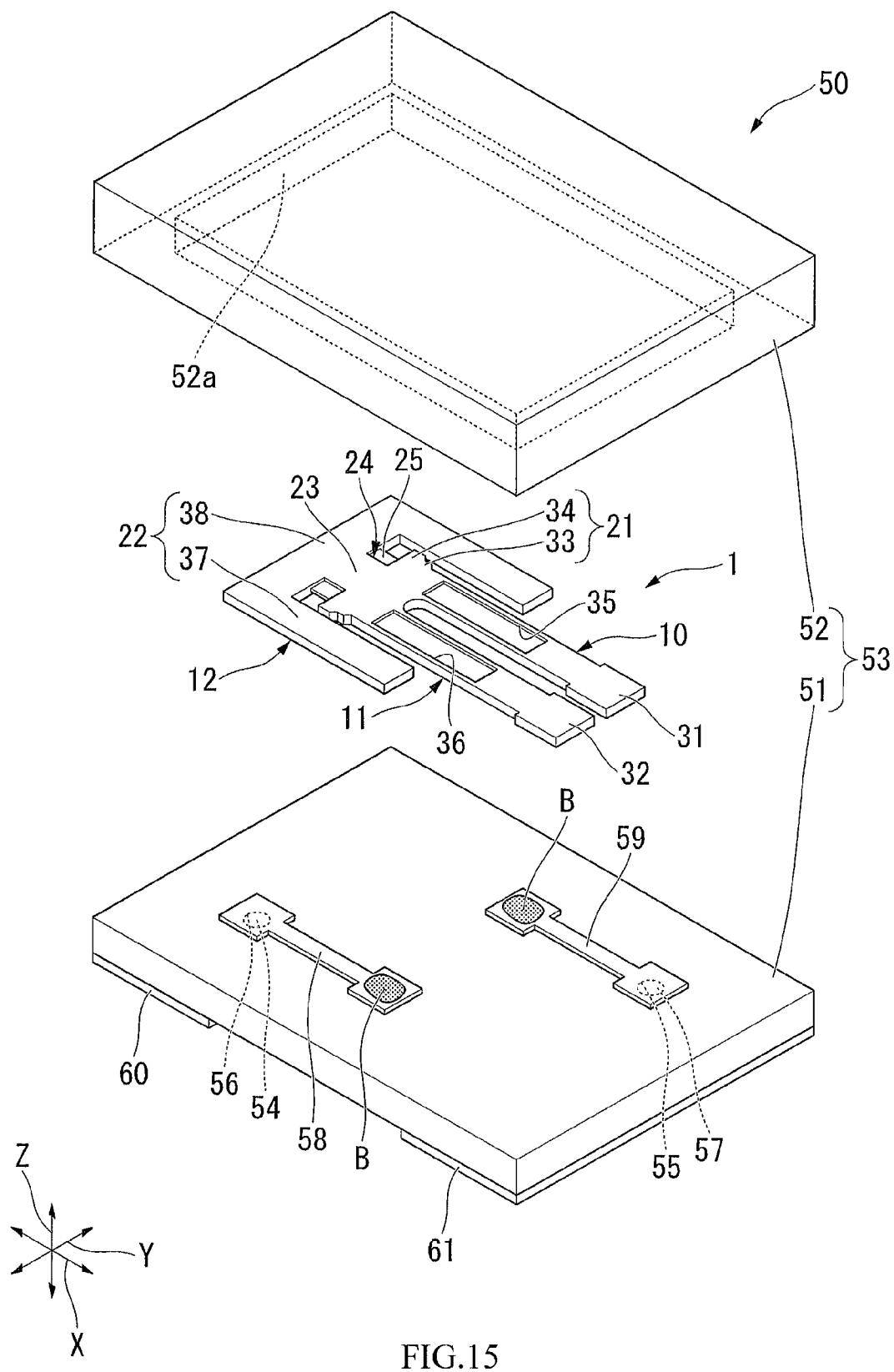
FIG. 15 is an exploded perspective view of the piezoelectric vibrator shown in FIG. 12.

As shown in FIG. 14 and FIG. 15, a pair of drawing electrodes 58 and 59 are patterned on an upper side (the side of the joint surface to which the lid substrate 52 is joined) of the base substrate 51. One drawing electrode 58 of the pair of drawing electrodes 58 and 59 extends along the X-direction on one end side of the base substrate 51 in the Y-direction. More specifically, the drawing electrode 58 covers the through electrode 56 on one end side thereof in the X-direction, while the other end side in the X-direction is arranged at an intermediate portion of the base substrate 51 in the X-direction.

The other drawing electrode 59 extends along the X-direction at the other end side of the base substrate 51 in the Y-direction. More specifically, one end side of the drawing electrode 59 in the X-direction is arranged at the intermediate portion of the base substrate 51 in the X-direction while the other end side of the drawing electrode 59 in the X-direction covers the through electrode 57. Therefore, the other end side of the drawing electrode 58 in the X-direction and the one end side of the drawing electrode 59 in the X-direction are arranged at the same position on the base substrate 51 in the X-direction, more specifically, at positions overlapping with the distal end portions of the side arms 37 of the piezoelectric vibration reed 1 in plan view.

Then, bumps B formed of gold or the like respectively are formed on the other end sides of the pair of drawing electrodes 58 and 59. The piezoelectric vibration reed 1 is mounted in a state in which the mount electrode formed on the mount portion 22 of the base portion 12 is in contact with the bumps B. Accordingly, the piezoelectric vibration reed 1 is supported in a state of coming off the base substrate 51, and is in a state of being electrically connected to the respective drawing electrodes 58 and 59.

In this embodiment, the mount electrode is formed until the distal end portions of the side arms 37, and the mount electrode is connected to the drawing electrodes 58 and 59 via the bumps B.

As shown in FIG. 12 to FIG. 15, external electrodes 60 and 61 to be electrically connected respectively to the pair of through electrodes 56 and 57 are formed on a lower surface of the base substrate 51.

When activating the piezoelectric vibrator 50 configured in this manner, a predetermined drive voltage is applied to the external electrodes 60 and 61 formed on the base substrate 51. Accordingly, a current is passed through the excitation electrodes of the piezoelectric vibration reed 1, so that the pair of vibrating arm portions 10 and 11 may be vibrated in the direction toward and away from each other (Y-direction) at the predetermined resonant frequency. Then, the piezoelectric vibrator 50 may be used as a time-of-day source, a timing source of a control signal or a reference signal source using the vibrations of the pair of vibrating arm portions 10 and 11.

According to the piezoelectric vibrator 50 of the embodiment, since the piezoelectric vibration reed 1 described above is provided, when the piezoelectric vibration reed 1 as described above is mounted in the cavity C, the piezoelectric vibrator 50 having high reliability and high quality which can effectively inhibit the vibration leak is provided while achieving the downsizing and maintaining the sufficient rigidity.

(Oscillator)

Subsequently, an embodiment of an oscillator according to the invention will be described with reference to FIG. 16.

Figure 16:
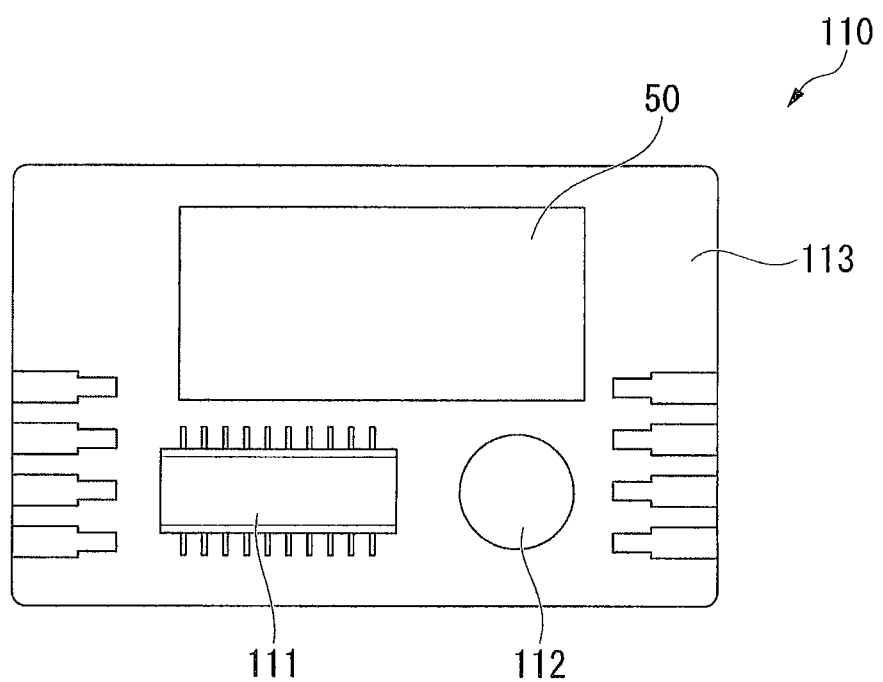
FIG. 16 is a schematic configuration drawing showing an oscillator of an embodiment of the invention.

An oscillator 110 in this embodiment includes a piezoelectric vibrator 50 configured as an oscillator electrically connected to an integrated circuit 111 as shown in FIG. 16. The oscillator 110 includes a substrate 113 on which an electronic element component 112 such as a capacitor is mounted. The substrate 113 includes the integrated circuit 111 described above for the oscillator mounted thereon, and the piezoelectric vibration reed of the piezoelectric vibrator 50 is mounted in the vicinity of the integrated circuit 111. The electronic element component 112, the integrated circuit 111, and the piezoelectric vibrator 50 are electrically connected respectively by a wiring pattern, not shown. The respective components are molded by a resin, not shown.

In the oscillator 110 configured in this manner, when a voltage is applied to the piezoelectric vibrator 50, the piezoelectric vibration reed 1 in the piezoelectric vibrator 50 vibrates. Such vibrations are converted into an electric signal by the piezoelectric property of the piezoelectric vibration reed 1, and is input to the integrated circuit 111 as the electric signal. The input electric signal is subjected to various processes by the integrated circuit 111 and is output as a frequency signal. Accordingly, the piezoelectric vibrator 50 functions as an oscillator.

In addition, by setting the configuration of the integrated circuit 111, for example, by selectively setting an RTC (Real Time Clock) module or the like according to the request, in addition to a function of a single-function oscillator for a time piece, a function to control the date and time of operation of the single-function oscillator for a time piece or external instruments or a function to provide the time of day or a calendar may be added.

According to the oscillator 110 in the embodiment, since the piezoelectric vibrator 50 configured as described above is provided, the oscillator 110 having high reliability and high quality is provided while achieving downsizing and maintaining a sufficient rigidity.

(Electronic Instrument)

Figure 17:
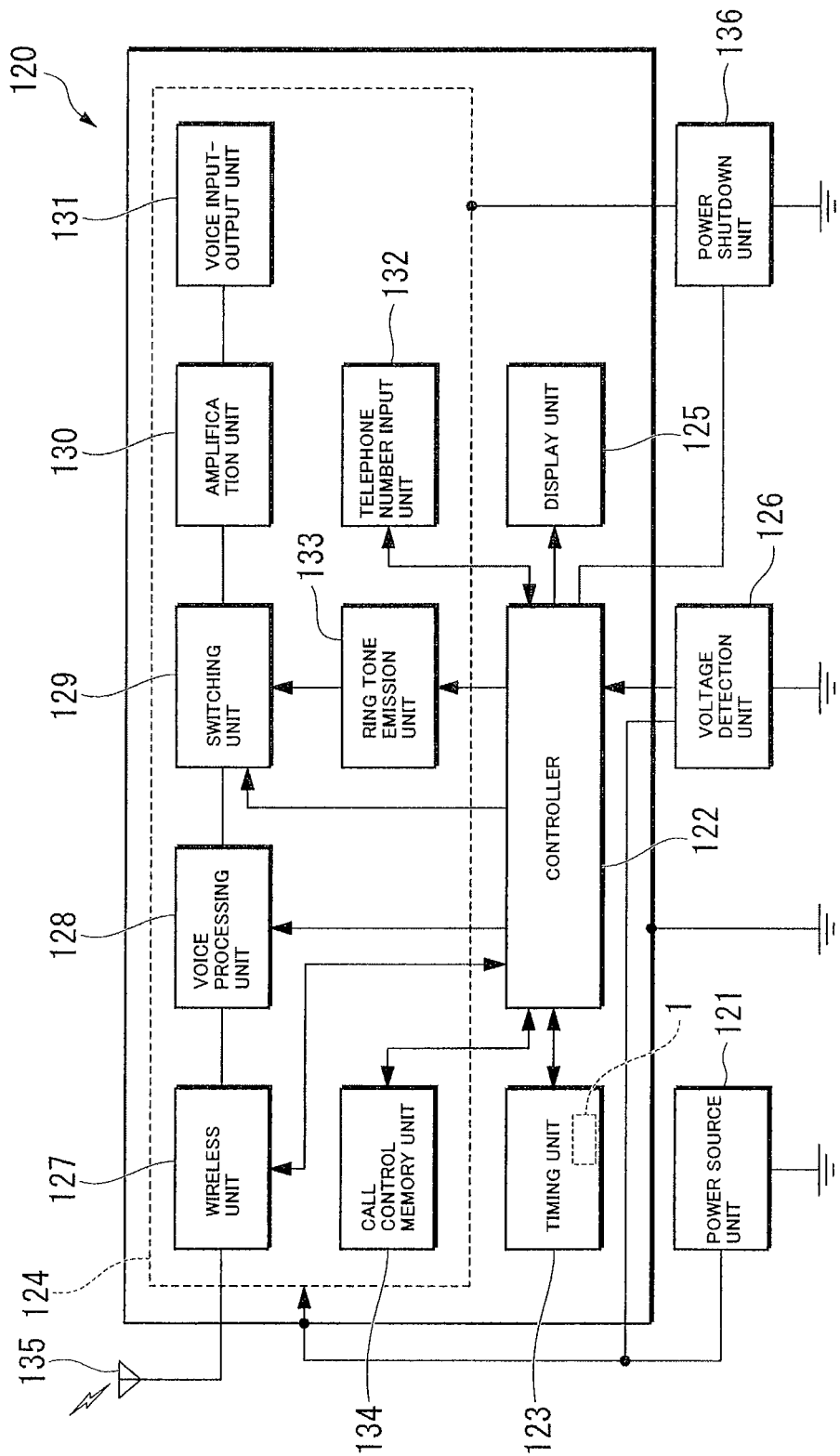
FIG. 17 is a schematic configuration drawing showing a portable digital assistant device of an embodiment of the invention.

Referring now to FIG. 17, an embodiment of an electronic instrument according to the invention will be described. A portable digital assistant device 120 having the piezoelectric vibrator 50 described above as the electronic instrument will be described as an example. First of all, the portable digital assistant device 120 in this embodiment is represented, for example, by a mobile phone, which is a developed and improved wrist watch of the related art. An appearance is similar to the wrist watch, including a liquid crystal display at a portion corresponding to a dial, which is configured to display current time or the like on a screen thereof. When used as a communication instrument, the same communication as the mobile phone of the related art may be performed by removing the same from the wrist and using a speaker and a microphone integrated in a potion inside a band. However, downsizing and reduction in weight are dramatically achieved in comparison with the mobile phone of the related art.

Subsequently, a configuration of the portable digital assistant device 120 of the embodiment will be described. The portable digital assistant device 120 includes the piezoelectric vibrator 50 and a power source unit 121 configured to supply power as shown in FIG. 17. The power source unit 121 is formed of, for example, a lithium secondary cell. To the power source unit 121, a control unit 122 configured to perform various types of control, a time counting unit 123 configured to count time of day or the like, a communication unit 124 configured to perform communication with the outside, a display unit 125 configured to display various items of information, and a voltage detection unit 126 configured to detect voltage of the respective functional portions are connected in parallel, each other. Then, the power is supplied to the respective functional portions by the power source unit 121.

The control unit 122 controls the operation of the entire system, such as controlling the respective functional portions to perform sending and receiving of voice data, and counting and display of the current time-of-day. The control unit 122 includes a ROM in which a program is written in advance, a CPU configured to read out and execute the program written in the ROM, and a RAM used as a work area for the CPU.

The time counting unit 123 includes an integrated circuit having an oscillation circuit, a register circuit, a counter circuit, and an interface circuit integrated therein, and the piezoelectric vibrator 50. When a voltage is applied to the piezoelectric vibrator 50, the piezoelectric vibration reed vibrates, and the vibrations thereof are converted into an electric signal by the piezoelectric property of crystal, and is input to the oscillation circuit as the electric signal. An output from the oscillation circuit is binarized and is counted by the register circuit and the counter circuit. Then, sending and receiving of the signal with respect to the control unit 122 are performed via the interface circuit, and the current time of day, the current date, calendar information, or the like are displayed on the display unit 125.

The communication unit 124 has the same function as the mobile phones of the related art, and includes a wireless unit 127, a voice processing unit 128, a switch unit 129, an amplification unit 130, a voice input/output unit 131, a phone number input unit 132, a ring tone generating unit 133, and a call control memory unit 134.

The wireless unit 127 performs sending and receiving of various types of data such as voice data with respect to a base station via an antenna 135. The voice processing unit 128 codes and decodes a voice signal input from the wireless unit 127 or the amplifying unit 130. The amplifying unit 130 amplifies a signal input from the voice processing unit 128 or the voice input/output unit 131 to a predetermined level. The voice input/output unit 131 includes a speaker or a microphone, or the like, and is configured to amplify a ringtone or a receiving voice, or collect a voice.

The ring tone generating unit 133 generates the ringtone according to a call from the base station. The switch unit 129 switches the amplification unit 130 connected to the voice processing unit 128 to the ring tone generating unit 133 only at the time of incoming call, so that the ringtone generated by the ring tone generating unit 133 is output to the voice input/output unit 131 via the amplifying unit 130.

The call control memory unit 134 stores a program relating to control of incoming and outgoing call of communication. The phone number input unit 132 includes, for example, numerical keys from 0 to 9 and other keys, and is configured to input a telephone number of the called party by pushing these numerical keys or the like.

The voltage detection unit 126 detects voltage drop when the voltage applied to the receptive functional portions such as the control unit 122 by the power source unit 121 becomes lower than a predetermined value, and notifies the same to the control unit 122. The predetermined voltage value at this time is a value preset as a minimum required voltage for keeping a stable operation of the communication unit 124 and, for example, on the order of 3V. The control unit 122 which receives the notification of the voltage drop from the voltage detection unit 126 prohibits the wireless unit 127, the voice processing unit 128, the switch unit 129, and the ring tone generating unit 133 from operating. In particular, the stop of the operation of the wireless unit 127 which consumes a large amount of power is essential. Then, the fact that the communication unit 124 is disabled due to insufficient remaining battery power is displayed on the display unit 125.

In other words, the operation of the communication unit 124 is prohibited by the voltage detection unit 126 and the control unit 122, and that effect may be displayed on the display unit 125. This display may be made by messages including characters. However, as a more intuitive display, a cross mark (x) may be shown on a phone icon displayed on an upper portion of a display surface of the display unit 125.

With the provision of a power source blocking unit 136 which is capable of selectively blocking the electric power of a portion relating to the function of the communication unit 124, the function of the communication unit 124 may be stopped further reliably.

According to the portable digital assistant device 120 in the embodiment, since the piezoelectric vibrator 50 described above is provided, the portable digital assistant device 120 having high reliability and high quality is provided while achieving downsizing and maintaining a sufficient rigidity.

(Radio Timepiece)

Figure 18:
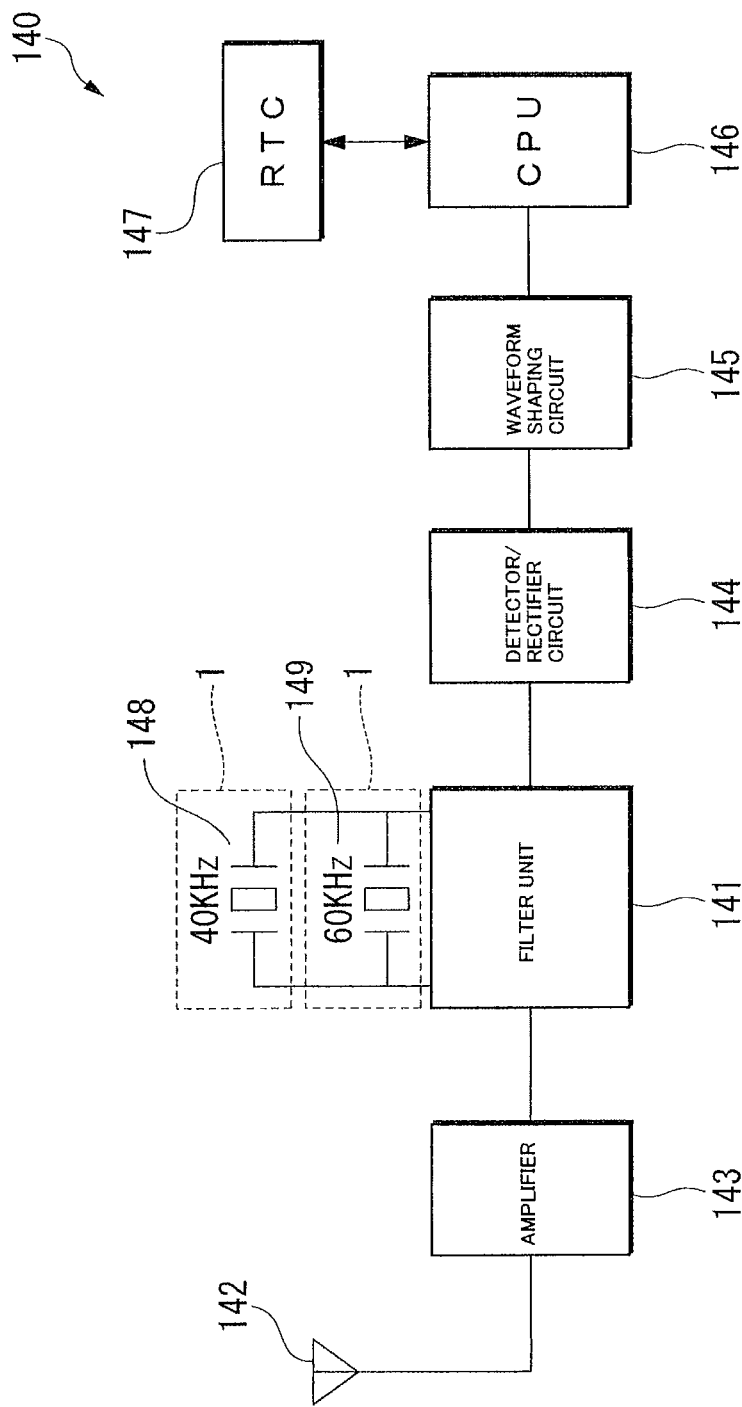
FIG. 18 is a schematic configuration drawing showing a radio timepiece of an embodiment of the invention.

Referring now to FIG. 18, an embodiment of a radio timepiece according to the invention will be described.

A radio timepiece 140 in this embodiment includes the piezoelectric vibrator 50 electrically connected to a filter portion 141 as shown in FIG. 18, and is a timepiece having a function to receive standard radio waves including timepiece information and display correct time of day automatically corrected.

In Japan, there are transmitting stations (transmitter stations) which transmit the standard radio waves in Fukushima prefecture (40 kHz) and Saga prefecture (60 kHz), and transmit respective standard radio waves. Since long waves such as 40 kHz or 60 kHz have both a property to propagate a ground surface and a property to propagate while being reverberate between an ionization layer and the ground surface, a wide range of the propagation is achieved, so that the above-described two transmitting stations cover entire part of Japan.

Hereinafter, a functional configuration of the radio timepiece 140 will be described in detail.

An antenna 142 receives a long-wave standard radio wave of 40 kHz or 60 kHz. The long-wave standard radio wave is time information referred to as a time code subjected to an AM modulation to a carrier wave of 40 kHz or 60 kHz. The long-wave standard radio wave is amplified by an amplifier 143 and is filtered and synchronized by the filter portion 141 having the plurality of piezoelectric vibrators 50.

The piezoelectric vibrators 50 in this embodiment include quartz vibrator units 148 and 149 having resonant frequencies of 40 kHz and 60 kHz which are the same as the above-described carrier frequencies, respectively.

In addition, a signal filtered and having a predetermined frequency is subjected to detection and demodulation by a detection and rectification circuit 144.

Subsequently, the time code is acquired via a waveform shaping circuit 145, and is counted by a CPU 146. The CPU 146 reads information such as the current year, day of year, day of the week, and time-of-day. The read information is reflected on an RTC 147, and correct time of day information is displayed.

Since the carrier wave has 40 kHz or 60 kHz, resonators having the above-described tuning-fork type structure are suitable for the quartz vibrator units 148 and 149.

The above-described description is based on an example in Japan, and the frequency of the long standard radio waves are different in foreign countries. For example, in Germany a standard radio wave of 77.5 kHz is used. Therefore, when integrating the radio timepiece 140 which is compatible with foreign countries in the portable apparatuses, another piezoelectric vibrator 50 having a frequency different from that in Japan is required.

According to the radio timepiece 140 in the embodiment, since the piezoelectric vibrator 50 described above is provided, the radio timepiece 140 having high reliability and high quality is provided while achieving downsizing and maintaining a sufficient rigidity.

The technical scope of the invention is not limited to the embodiments described above, and various modifications may be made without departing the scope of the invention.

For example, in the embodiment described above, the piezoelectric vibration reed 1 in the invention is employed in the surface-mounted piezoelectric vibrator 50. However, the invention is not limited thereto, and the piezoelectric vibration reed 1 of the invention may be used for a piezoelectric vibrator of a cylinder package type.

In addition, the configurations described above may be sorted out or may be changed to other configurations as needed without departing the scope of the invention.

I claim:

1. A piezoelectric vibration reed, comprising:
   a pair of vibrating arm portions arranged in parallel to each other; and
   a base portion integrally coupled to proximal ends of the pair of the vibrating arm portions in a longitudinal direction that the vibrating arm portions extend, wherein the base portion includes:
      a connecting portion which is located on a distal end side of the base portion along the longitudinal direction and to which the proximal end of the vibrating arm portions are coupled; and
      a mount portion located on a proximal end of the base portion along the longitudinal direction for mounting the base portion;
      a narrow portion between the connecting portion and the mount portion, the narrow portion having a length narrower than a length of the connecting portion and a length of the mount portion in a width direction of the piezoelectric vibration reed which is perpendicular to the longitudinal direction;
      a pair of notched portions notched respectively inwardly from both sides of the base portion in the width direction to form the narrow portion; and
      ribs projecting outwardly in the width direction of the base portion and arranged in the interiors of the notched portions wherein the pair of notched portions accommodate the ribs such that outside end portions of the ribs in the width direction of the piezoelectric vibration reed are located inside the connecting portion and the mount portion;
      wherein a combined length of the narrow portion and the ribs is narrower than the length of the connection portion and the length of the mount portion in the width direction of the piezoelectric vibration reed.

2. The piezoelectric vibration reed of claim 1, wherein a route through which vibrations excited by the vibrating arm portions are transmitted to the base portion comprises the narrow portion formed between the notched portions.

3. The piezoelectric vibration reed of claim 1, wherein the ribs are formed at intermediate portions of the narrow portion in a thickness direction orthogonal to the longitudinal direction and the width direction of the base portion.

4. The piezoelectric vibration reed of claim 1, wherein the ribs are formed at one end of the narrow portion in a thickness direction orthogonal to the longitudinal direction and the width direction of the base portion.

5. The piezoelectric vibration reed of claim 1, wherein the thickness of the ribs along a thickness direction is set to be ½ or smaller with respect to the thickness of the base portion in the thickness direction orthogonal to the width direction and the longitudinal direction of the base portion.

6. The piezoelectric vibration reed of claim 1, wherein the thickness of the ribs along the thickness direction is set to be ⅓ or larger with respect to the thickness of the base portion in the thickness direction orthogonal to the width direction and the longitudinal direction of the base portion, thereby sufficiently securing rigidity of the base portion.

7. The piezoelectric vibration reed of claim 1, wherein each notched portion has a circular shape.

8. The piezoelectric vibration reed of claim 1, wherein a width of each notched portion in the longitudinal direction is gradually reduced from an outside toward an inside of the piezoelectric vibration reed in the width direction.

9. The piezoelectric vibration reed of claim 1, wherein a width of each notched portion in the longitudinal direction is smaller than a width of the ribs in the longitudinal direction.

10. The piezoelectric vibration reed of claim 1, wherein a distal end of a vibrating arm portion is enlarged to form a hammer-shape portion.

11. The piezoelectric vibration reed of claim 1, wherein each vibrating arm portion comprises a groove having a rectangular shape extending in the longitudinal direction.

12. The piezoelectric vibration reed of claim 1, wherein the connecting portion comprises a first base portion and a second base portion and a width of the connecting portion increases in a width direction orthogonal to the longitudinal direction, wherein a width of the first base portion is smaller than a width of the second base portion.

13. The piezoelectric vibration reed of claim 1, wherein the mount portion further comprises side arms extended toward both sides.

14. A piezoelectric vibrator comprising the piezoelectric vibration reed of claim 1, wherein the piezoelectric vibration reed of the invention is hermetically sealed in a package.

15. An oscillator comprising the piezoelectric vibrator of claim 14, wherein the piezoelectric vibrator is electrically connected to an integrated circuit as an oscillating element.

16. An electronic instrument comprising the piezoelectric vibrator of claim 14, wherein the piezoelectric vibrator is electrically connected to a clocking unit.

17. A radio timepiece comprising the piezoelectric vibrator of claim 14, wherein the piezoelectric vibrator is electrically connected to a filter portion.

* * * * *